(12) United States Patent
Matero et al.

(10) Patent No.: US 7,522,011 B2
(45) Date of Patent: Apr. 21, 2009

(54) HIGH PASS MODULATION OF A PHASE LOCKED LOOP

(75) Inventors: Jorma Matero, Oulu (FI); Niall Eric Shakeshaft, Helsinki (FI)

(73) Assignee: Nokia Corporation, Espoo (FI)

( * ) Notice: Subject to any disclaimer, the term of this patent is extended or adjusted under 35 U.S.C. 154(b) by 651 days.

(21) Appl. No.: 11/204,759

(22) Filed: Aug. 15, 2005

(65) Prior Publication Data

US 2007/0036238 A1     Feb. 15, 2007

(51) Int. Cl.
    *H03L 7/197*     (2006.01)
(52) U.S. Cl. .......................... 332/128; 332/127; 331/23; 331/16
(58) Field of Classification Search ................ 332/128, 332/127; 331/23, 16
    See application file for complete search history.

(56) References Cited

U.S. PATENT DOCUMENTS 5,952,895 A     9/1999     McCune, Jr. et al.

7,012,470 B2 *   3/2006   Suzuki et al. ................. 331/16

OTHER PUBLICATIONS

"Wide bandwidth frequency modulation of phase lock loops;" David Rosemarin; RF time and frequency; www.rfdesign.com; Feb. 2000.

* cited by examiner

*Primary Examiner*—Joseph Chang
(74) *Attorney, Agent, or Firm*—Alfred A. Fressola; Ware, Fressola, Van Der Sluys & Adolphson, LLP

(57) ABSTRACT

A radio frequency modulator based on direct frequency/phase modulation of output signal of a controllable oscillator (724) that is a part of a phase locked loop (PLL) provides a direct modulator that is able to operate over a wide frequency range with a flat frequency response. A modulation signal is digitally processed (721, 730) before injection to a high-pass path of a direct modulator. Applicability of digital signal processing is based on the fact that the modulation signal is a base band signal. Therefore, the modulation signal (702) occupies such a band in the frequency domain so that a sufficient ratio of a sampling rate to an upper edge frequency of the modulation signal can be achieved. Digital processing is used for compensating an effect of non-flat high-pass PLL transfer function and/or to perform pre-distortion of the input signal of a controlled oscillator to compensate an effect of non-linearity of a controlled oscillator.

33 Claims, 8 Drawing Sheets

HIGH PASS MODULATION OF A PHASE
LOCKED LOOP

FIELD OF THE INVENTION

The invention relates to radio frequency modulators. The invention especially concerns a radio frequency modulator based on direct modulation of an out-put signal of a controllable oscillator that is a part of a phase locked loop.

BACKGROUND OF THE INVENTION

Modulation can be defined as alteration of one or more characteristics of a certain waveform as a function of another signal that represents information. In radio frequency communication systems, a waveform the characteristics of which are altered is typically a sine wave. In this document a modulated sine wave is called a carrier and a signal that represent information is called a modulation signal. There are several methods for modulating a carrier, like linear amplitude modulation, frequency modulation, and phase modulation. In quadrature amplitude modulation (QAM) there are two sine waves being in a 90 degrees phase shift respect to each other. Each sine wave is modulated with amplitude modulation, and the modulated sine waves are summed together to form a final modulated signal. Quadrature amplitude modulation is called also IQ-modulation, illustrating a system having one 'in-phase carrier' and another 90 degrees phase shifted 'quadrature carrier'. The QAM-modulation is however a complex modulation method requiring two parallel amplitude modulation branches in a modulator circuitry. This kind of complexity increases manufacturing costs, required space, and power consumption of a modulator circuitry. For example, in a mobile phone it is very important that signal processing elements, e.g. modulators, are small and cost effective and the power consumption of them is low. Therefore, there is a tendency towards frequency/phase modulation based on direct modulation of an output signal of a controllable oscillator that is a part of a phase locked loop. A controlled oscillator can be, for example, a voltage controlled oscillator (VCO) whose input voltage determines the output frequency.

DESCRIPTION OF THE PRIOR ART

FIG. 1 shows a signal flow diagram of a direct phase modulator according to the prior art based on a phase locked loop (PLL). The inputs of the modulator are a reference signal 101 and a modulation signal 102. The output of the modulator is a modulated signal 107. In the following the reference signal 101, the modulation signal 102, and the modulated signal 107 that are functions of time t are denoted by R(t), S(t), and M(t), respectively. Let us assume that the reference signal 101 has the following form:

$$R(t)=A \sin(\Psi r(t)), \qquad (1)$$

where $\Psi r(t)$ is a phase (radians) of the reference signal. A time derivative of the phase $(d\Psi r(t)/dt)$ is an instantaneous angular frequency $\omega r$ [radians/second] of the reference signal, A is an amplitude of the reference signal. The angular frequency $\omega r$ is assumed to be substantially constant over time, i.e. $\Psi r(t) = \omega r^* t + \Psi r(0)$, i.e. the reference signal is sinusoidal. Without loosing generality we can set A=1. The reference signal can be formed e.g. with a local crystal oscillator or it can be derived from a signal received by e.g. a mobile phone. From the viewpoint of this invention the actual method for forming the reference signal is immaterial. The modulated signal 107 can be written in a form:

$$M(t)=B \sin(\Psi m(t)) \text{ and } \omega m(t)=d\Psi m(t)/dt, \qquad (2)$$

where $\Psi m(t)$ is a phase of the modulated signal and $\omega m(t)$ is the instantaneous angular frequency of the modulated signal that is a time derivative of the phase. Without loosing generality we can set amplitude B=1.

The modulated signal 107 is led to a frequency divider 110 that forms a signal 104. The signal 104 is $\sin(\Psi m(t)/Q)$, where Q is the frequency division ratio that can be an integer or a non-integer rational number. Phase comparator 108 forms its output signal 103 according to mutual phase difference between the reference signal 101 and the output signal 104 of the frequency divider 110. The output signal 103 of the phase comparator is summed with the modulation signal 102 and the result 105 is low-pass filtered in a loop filter 111. An output signal 106 of the loop filter controls a controlled oscillator 109. The instantaneous frequency $(d\Psi m(t)/dt)$ of the modulated signal is a function of the output signal 106 of the loop filter. If the frequency divider output 104 lags the reference signal 101, the output signal of the phase comparator tries to make the controlled oscillator 109 to increase its output frequency $(d\Psi m(t)/dt)$. Correspondingly, if the frequency divider output 104 leads the reference signal 101, the output signal of the phase comparator tries to make the controlled oscillator to decrease its output frequency. If we assume that the modulation signal 102 is zero and the controlled oscillator is able to produce a pure sinusoid without harmonics the modulated signal 107 in a steady state is:

$$M(t)=\sin(Q^*\omega r^*t), \qquad (3)$$

i.e. the instantaneous frequency of the modulated signal 107 $\omega m(t)$ $(=d\Psi m(t)/dt)$ is $Q * \omega r$, which constitutes a centre frequency. When we add the modulation signal 102 and perform a small signal analysis in a frequency domain we get:

$$\Psi m(j\lambda) = S(j\lambda) \times \frac{F(j\lambda)/j\lambda}{1+F(j\lambda)/j\lambda Q} + \frac{\omega r}{j\lambda} \times \frac{F(j\lambda)/j\lambda}{1+F(j\lambda)/j\lambda Q}, \qquad (4)$$

where $\lambda$ is an analysis angular frequency and j is an imaginary unit. $S(j\lambda)$ is a $\lambda$-frequency component of the modulation signal S(t). $\Psi m(j\lambda)$ is a $\lambda$-frequency component of the phase $\Psi m(t)$ of the modulated signal 107. $F(j\lambda)$ is a transfer function of the loop filter 111. As can be seen from equation (4) the phase of the modulated signal is proportional to the modulation signal via a closed-loop transfer function. Therefore, the system shown in FIG. 1 performs direct phase modulation. A direct frequency modulation according to prior art is shown in FIG. 2. A phase of a modulated signal is proportional to a time integral 203 of the modulation signal via a same closed-loop transfer function as in equation (4) (i.e. the instantaneous angular frequency of the modulated signal is proportional to the modulation signal via the closed-loop transfer function). In the continuation of this document we do not handle direct phase and direct frequency modulation separately. In this document a term "direct modulation" means either direct phase or direct frequency modulation and transformation between these two types can be performed by adding/removing a time integration or a time differentiation block on/from the route of the modulation signal 102, 202.

The bandwidth of the loop filter 111 has to be made narrow enough in order to guarantee the stability of a closed-loop system. A total open-loop gain must drop below unity before a total open-loop phase turns to −180 degrees. An inherent limitation of systems shown in FIGS. 1 and 2 is the fact that the modulation signal 102, 202 is filtered by the closed-loop transfer function $$\frac{F(j\lambda)/j\lambda}{1+F(j\lambda)/j\lambda Q}.$$

A frequency response of the closed-loop transfer function is of low-pass type. In the continuation of this document the closed-loop transfer function is called a low-pass PLL transfer function. Correspondingly, a system shown in FIGS. 1 or 2 is called a low-pass direct modulator. A bandwidth of the low-pass PLL transfer function is in many applications, e.g. in a WCDMA mobile phone (Wide band Code Division Multiple Access) essentially narrower than a frequency range of the modulation signal 102, 202. Therefore, the systems shown in FIGS. 1 and 2 cannot perform direct modulation over the whole frequency range of the modulation signal 102, 202. A straightforward attempt to correct this limitation would be to use a pre-compensation filter, the frequency response of which is an inverse of that of the low-pass PLL transfer function, and to filter the modulation signal 102, 202 with the pre-compensation filter before injecting it to a phase locked loop. This kind of pre-compensation filter is, however, not feasible. For example, in those frequency areas in which the gain of the low-pass PLL transfer function is very low the gain of the compensation filter should be unrealistically high. If there were a transfer null in the low-pass PLL transfer function on the frequency range of the modulation signal, any (finite) gain of the pre-compensation filter would not be sufficient.

FIG. 3 shows a signal flow diagram of a direct modulator according to prior art. In this method the modulation signal is injected to two points 315,316 in a phase locked loop. Before the injection points the modulation signal is filtered with pre-compensation filters 313 and 314. Using similar notations as in the case of FIG. 1 we get with frequency domain analysis:

$$\Psi m(j\lambda) = S(j\lambda) \times \frac{FL(j\lambda) \times F(j\lambda)/j\lambda}{1+F(j\lambda)/j\lambda Q} + S(j\lambda) \times \qquad (5)$$

$$\frac{FH(j\lambda)/j\lambda}{1+F(j\lambda)/j\lambda Q} + \frac{\omega r}{j\lambda} \times \frac{F(j\lambda)/j\lambda}{1+F(j\lambda)/j\lambda Q},$$

where $FL(j\lambda)$ and $FH(j\lambda)$ are the transfer functions of the pre-compensation filters 313 and 314. In principle, choosing $FL(j\lambda)=1/Q$ and $FH(j\lambda)=j\lambda$ we get a flat transfer function between the modulation signal 302 ($S(j\lambda)$) and the phase ($\Psi m(j\lambda)$) of the modulated signal 307. Time derivation, i.e. $FH(j\lambda)=j\lambda$, is almost always unfeasible. Therefore, it is more realistic to choose $FL(j\lambda)=1/j\lambda Q$ and $FH(j\lambda)=1$. This selection gives a flat transfer function between time integral ($S(j\lambda)/j\lambda$) of the modulation signal and the phase ($\Psi m(j\lambda)$) of the modulated signal.

A frequency response of the following transfer function $$\frac{1/j\lambda}{1+F(j\lambda)/j\lambda Q}$$

is of high-pass type at least in certain sense and in this document it is called a high-pass PLL transfer function. This transfer function expresses the fact that the loop tries to clean up the modulation signal on a loop bandwidth as if it were noise at the input of the controlled oscillator 309. In the continuation of this document a modulator of the kind described above in which the modulation signal is fed to two points in a PLL is called a two-point direct modulator. The modulation signal fed to a first point is filtered with a low-pass PLL transfer function and the modulation signal fed to a second point is filtered with a high-pass PLL transfer function. A signal path containing a low-pass PLL transfer function is called "a low-pass path" and a signal path containing a high-pass PLL transfer function is called "a high-pass path".

Two-point direct modulation is quite demanding dealing with quality of gain and delay balances between a low-pass path and a high-pass path. In FIG. 3, output signals of the pre-compensation filters 313 and 314 have to be in excellent amplitude and delay balance over the whole frequency range of the modulation signal 302. If a signal via one path is too strong or in an improper phase shift with respect to a signal via another path, adverse distortion of modulation will occur. Balancing both the gain and the delay is a demanding task that requires complicated signal processing elements. A need for complicated signal processing elements means realization costs, a need for space, and power consumption. Reference U.S. Pat No. 5,952,895 presents a method for gain balancing in a two-point direct modulator. In this method the modulated high frequency signal is demodulated and a phase of the result is compared to that of the modulation signal. The result of the phase comparison is used for controlling amplitude of the signal injected to a high-pass path of a PLL. A mutual time shift of the signals injected to the high-pass path and to the low-pass path is not controlled. An advantage of this kind of feedback system is the fact that the system is in some extent able to compensate possible non-linearity of a controlled oscillator. In this document non-linearity of a controlled oscillator means that output frequency versus input signal intensity curve is not a straight line, e.g. in a VCO output frequency is not a straight line as a function of input voltage.

Reference D. Rosemarin (Wide bandwidth frequency modulation of phase lock loops, RF Design Magazine, February 2000) presents an approach in which modulation signal is fed only via a high-pass path of a PLL. In this document a modulator based on this approach is called a high-pass direct modulator. An inherent advantage of a high-pass direct modulator when compared with a two-point direct modulator is the fact the there is no need for gain/delay balancing. A signal flow diagram of a high-pass direct modulator is shown in FIG. 4. Using similar notations as in the previous cases we get with a frequency domain analysis:

$$\Psi m(j\lambda) = S(j\lambda) \times \frac{FH(j\lambda)/j\lambda}{1+F(j\lambda)/j\lambda Q} + \frac{\omega r}{j\lambda} \times \frac{F(j\lambda)/j\lambda}{1+F(j\lambda)/j\lambda Q}. \qquad (6)$$

An advantage of a high-pass direct modulator compared to a low-pass direct modulator is the fact that for a transfer function $$\frac{1}{1+F(j\lambda)/j\lambda Q}$$

a pre-compensation filter can be built without facing similar realization problems as when dealing with a low-pass direct modulator. If we choose a transfer function of a pre-compensation filter to be $FH(j\lambda)=1+F(j\lambda)/j\lambda$ there will be a flat transfer function between time integral $(S(j\lambda)/j\lambda)$ of the modulation signal and the phase $(\Psi m(j\lambda))$ of the modulated signal. In reference D. Rosemarin the pre-compensation filter that compensates the effect of a non-flat high-pass PLL transfer function is realised as an analogue filter with resistors, capacitors, and operational amplifiers. Both voltage and current input (charge pump) approaches are presented. A challenging task in this approach is to make the pre-compensation filter to correspond with the high-pass PLL transfer function accurately enough over a whole frequency rage of the modulation signal. Values of the analogue components may vary with changing temperature. When a modulator is manufactured an individual component does not in a general case have its nominal value, e.g. nominal resistance, but the value is a sample from a certain distribution with a certain mean value and a certain standard deviation. The analysis presented above was highly simplified. A phase comparator, a controlled oscillator, and a frequency divider were assumed to be ideal elements. In a real system a precompensation filter has to compensate also effects of transfer functions of a controlled oscillator, a phase comparator, and a frequency divider. Furthermore, controlled oscillators are not linear. This non-linearity introduces distortion into modulation. These facts make the use of an analogue precompensation filter even more challenging.

The frequency/phase modulated signal 107, 207, 307, 407 can be amplitude modulated with an amplifier circuit a gain of which depends on amplitude modulation signal. Amplitude modulation is not shown in FIGS. 1, 2, 3 and 4. A modulator that comprises both a PLL based frequency/phase modulation part and an amplitude modulation part as described above is often called a polar modulator. In this document term "direct modulator" is used for covering also a modulator comprising both a PLL based frequency/phase modulation part and an amplitude modulation part.

In the view of various limitations of direct modulators according to prior art, it would be desirable to avoid or mitigate these and other drawbacks and limitations associated with the prior art.

BRIEF DESCRIPTION OF THE INVENTION

It is an objective of the present invention to provide a direct modulator in which the limitations and drawbacks associated with the prior art are eliminated or reduced. It is also an object of the present invention to provide a mobile communication device having a direct modulator in which the limitations and drawbacks associated with the prior art are eliminated or reduced. It is also an object of the present invention to provide a communication module that can be used as a component of e.g. a mobile phone, the communication module having a direct modulator in which the limitations and drawbacks associated with the prior art are eliminated or reduced.

The objectives of the invention are achieved with a solution in which a modulation signal is digitally processed in a high-pass direct modulator before the modulation signal is injected to a high-pass path of a direct modulator. Applicability of digital signal processing is based on the fact that the modulation signal is a base band signal. Therefore, the modulation signal occupies such a band in the frequency domain that a sufficient ratio of a sampling rate to an upper edge frequency of the modulation signal can be achieved. Digital processing is used for compensating an effect of non-flat high-pass PLL transfer function and/or to perform pre-distortion of the input signal of a controlled oscillator to compensate an effect of non-linearity of a controlled oscillator.

The invention yields appreciable benefits compared to prior art solutions:

a pre-compensation filter can be constructed in an accurate way because in a digital realization there is no such component value uncertainty as in conjunction with an analogue pre-compensation filter, a pre-compensation filter can be made adaptive, and therefore an accurate pre-compensation is achieved, power losses inherent to resistors of analogue pre-compensation filters are avoided, different shapes of input signal intensity versus output frequency curves of controlled oscillators can be compensated with digital predistortion.

In this document a point (as 315 or 316 in FIG. 3) at which a signal that modulates the output frequency/phase of a PLL is injected to the PLL is called "an injection point". An injection point (as 315 in FIG. 3) that is located on a signal path from an output of a loop filter to an input of a controlled oscillator or at an input of a controlled oscillator is called "a high-pass injection point". Correspondingly, an injection point (as 316 in FIG. 3) that is located on a signal path from an output of a controlled oscillator to an input of a loop filter is called "a low-pass injection point".

A direct modulator according to the invention is characterized in that it comprises:
  a phase locked loop, hereinafter PLL, having a controlled oscillator,
  a modulation signal input for receiving a modulation signal,
  digital processing means for processing a modulation signal in a digital form for performing at least one of the following: compensating an effect of a non-flat frequency response of a high-pass PLL transfer function, and compensating an effect of non-linearity of the controlled oscillator, and
  connection means disposed to convert a digital output signal of said digital processing means into a form supported by a high-pass injection point of the PLL and to operate the direct modulator as a high-pass direct modulator by feeding a resulting converted signal into said highpass injection point of the PLL.

A mobile communication device according to the invention is characterized in that it comprises:
  a direct modulator having a modulation signal input for receiving a modulation signal and being based on a phase locked loop, hereinafter PLL, the PLL having a controlled oscillator,
  digital processing means for processing a modulation signal in a digital form for performing at least one of the following: compensating an effect of a non-flat frequency response of a high-pass PLL transfer function, and compensating an effect of non-linearity of the controlled oscillator, and
  connection means disposed to convert a digital output signal of said digital processing means into a form supported by a high-pass injection point of the PLL and to operate the direct modulator as a high-pass direct modulator by feeding a resulting converted signal into said high-pass injection point of the PLL.

A communication module according to the invention is characterized in that it comprises:
  a direct modulator having a modulation signal input for receiving a modulation signal and being based on a phase locked loop, hereinafter PLL, the PLL having a controlled oscillator,
  digital processing means for processing a modulation signal in a digital form for performing at least one of the following: compensating an effect of a non-flat frequency response of a high-pass PLL transfer function, and compensating an effect of non-linearity of the controlled oscillator, and connection means disposed to convert a digital output signal of said digital processing means into a form supported by a high-pass injection point of the PLL and to operate the direct modulator as a high-pass direct modulator by feeding a resulting converted signal into said high-pass injection point of the PLL.

A method for performing a direct modulation according to the invention is characterized in that it comprises:

processing modulation signal in a digital form for performing at least one of the following list: compensating an effect of a non-flat frequency response of a high-pass transfer function of a phase locked loop of a direct modulator, and compensating an effect of non-linearity of a controlled oscillator of the phase locked loop of the direct modulator, converting an digital output signal of said processing into a form supported by a high-pass injection point of the phase locked loop, and operating the direct modulator as a high-pass direct modulator by feeding a resulting converted signal into said high-pass injection point of the phase locked loop.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in a sense of examples and with reference to the accompanying drawings, in which.

DETAILED DESCRIPTION OF THE PREFERRED EMBODIMENTS OF THE INVENTION

FIGS. 1-4 have been explained above in the description of the prior art.

Figure 1:
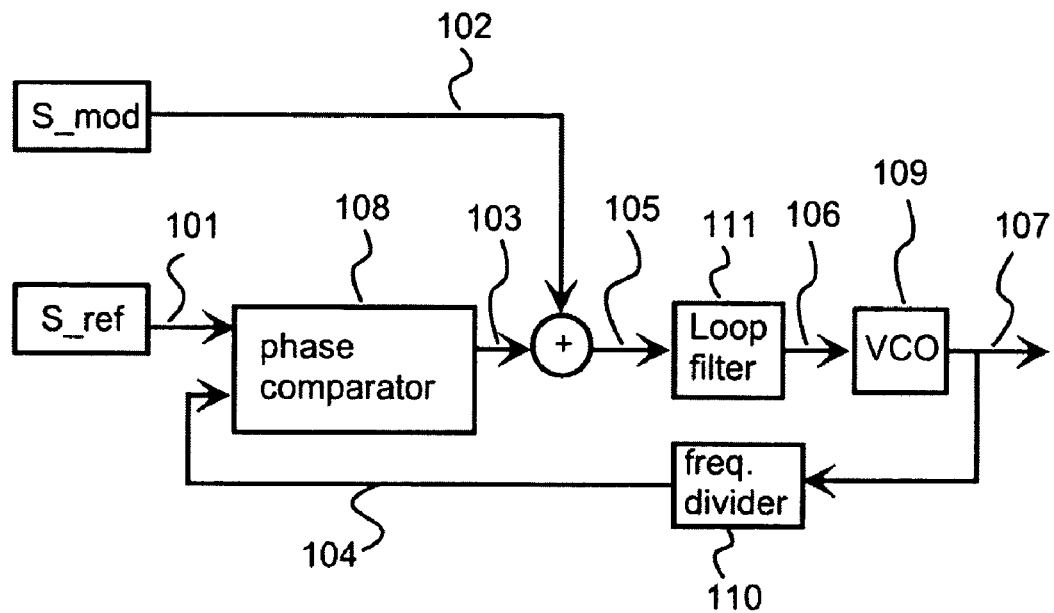
FIG. 1 shows a signal flow diagram of a direct phase modulator according to the prior art based on a phase locked loop (PLL)
Figure 2:
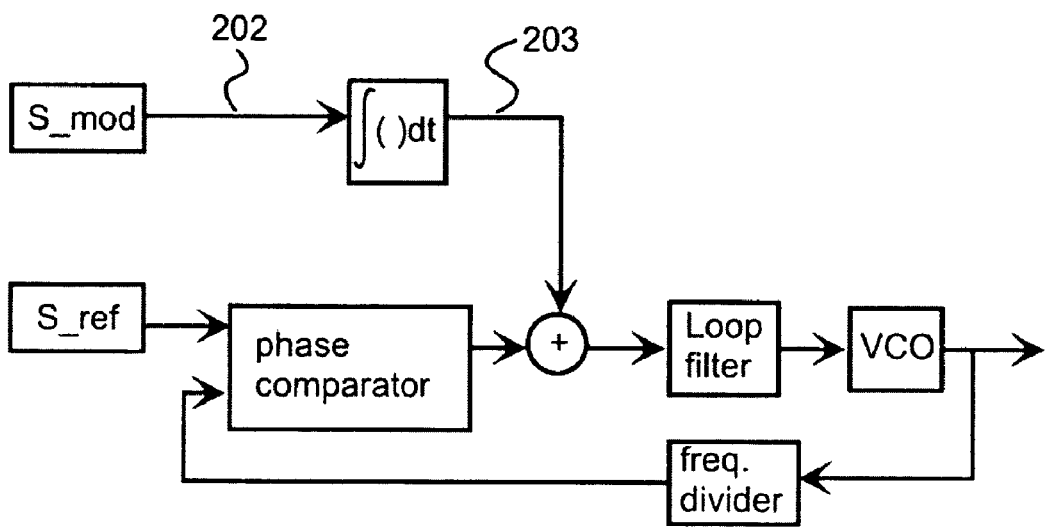
FIG. 2 shows a signal flow diagram of a direct frequency modulator according to the prior art based on a phase locked loop (PLL)
Figure 3:
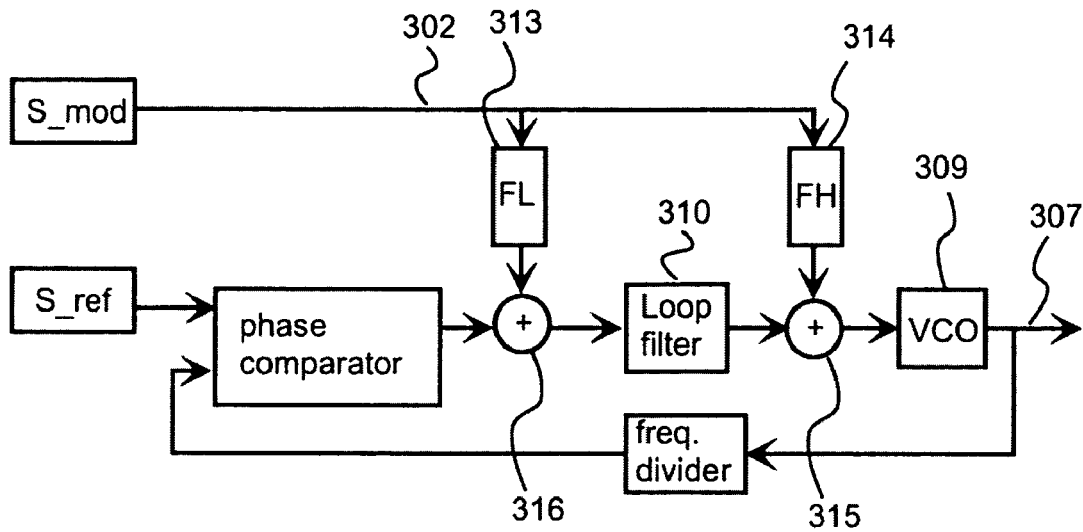
FIG. 3 shows a signal flow diagram of a two-point direct modulator according to the prior art based on a phase locked loop (PLL)
Figure 4:
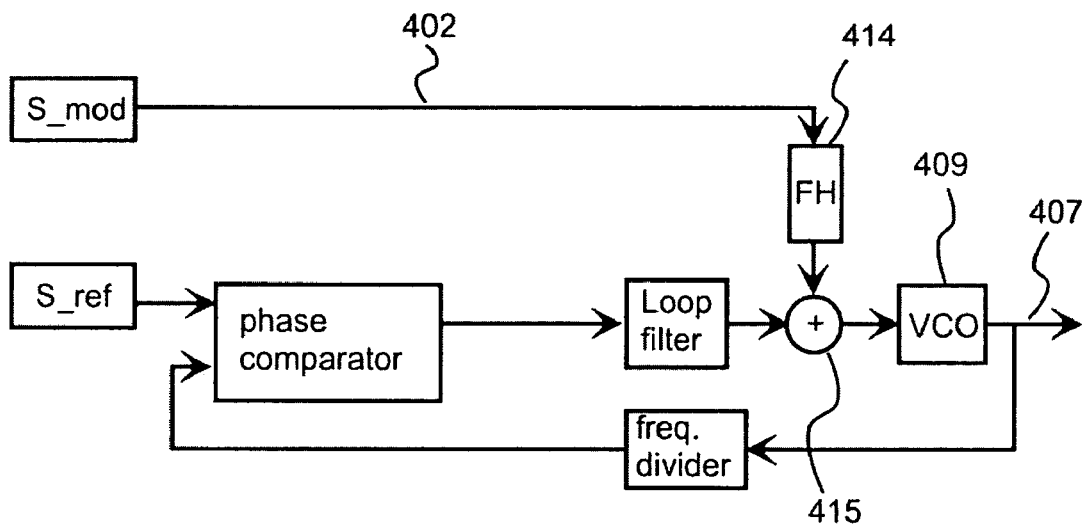
FIG. 4 shows a signal flow diagram of a high-pass direct modulator according to the prior art based on a phase locked loop (PLL)
Figure 5:
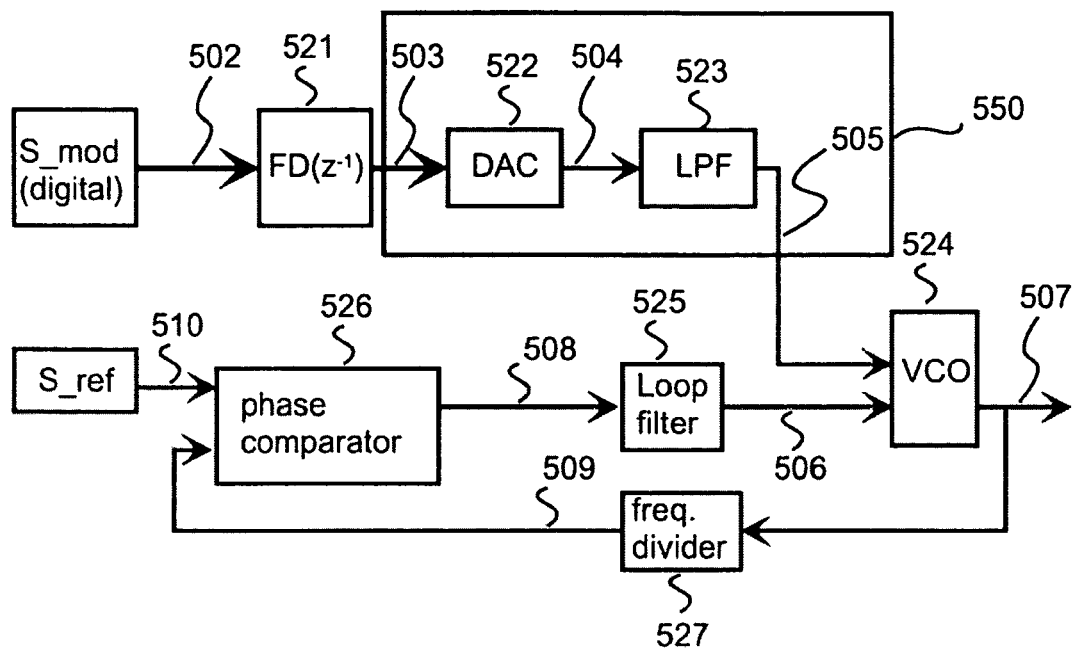
FIG. 5 shows a block diagram of a direct modulator according to an embodiment of the invention.

FIG. 5 shows a block diagram of a direct modulator according to an embodiment of the invention. A modulation signal 502 is presented in a digital form with a sufficient number of bits. The number of bits in a digital signal representation and in digital signal processing has to be so high, i.e. bit accuracy has to be so good, that quantization noise due to the fact that a digital representation can present only a finite number of values is on an acceptable level. A sample rate in digital signal processing has to be so high that even the highest frequency components of signals to be processed can be handled without aliasing effects. In FIG. 5, digital signals are presented with a bigger line width than analogue signals.

Digital modulation signal is filtered with a digital pre-compensation filter 521 that compensates a non-flat frequency response of a high-pass PLL transfer function. The digital pre-compensation filter is a linear filter; frequency domain analysis a result of which is a frequency response is based on an assumption of linearity. A high-pass PLL transfer function includes filtering effects of an analogue loop filter 525, a phase comparator 526, a frequency divider 527, and a controlled oscillator 524. The controlled oscillator can be a voltage-controlled oscillator (VCO) or it can be a current controlled oscillator. The digital pre-compensation filter 521 can be a finite impulse response (FIR) or an infinite impulse response (IIR) filter. Parameters of the digital precompensation filter (tap coefficients of an FIR-filter or nominator and denominator coefficients of an IIR-filter) can be determined, for example, by seeking experimentally the FIR-tap coefficients or IIR-parameters that give an optimal result. The filter parameters can also be calculated with the aid of a measured or simulated step or pulse response of the high-pass PLL transfer function.

The controlled oscillator 524 has two analogue inputs, and an instantaneous output frequency of the controlled oscillator depends on a joint effect of signals at both of the inputs. For example, the output frequency can be a function of a sum of the input signals 505 and 506. The input for the signal 505 represents the high-pass injection point of the PLL. It is also possible to add signals 505 and 506 with an analogue adder and to use a single-input controlled oscillator. In this case an adder input for the signal 505 represents the high-pass injection point. Connecting means 550 converts the output signal 503 of the digital pre-compensation filter 521 into a form supported by the high-pass injection point and operates the direct modulator as a high-pass direct modulator by feeding the high-pass injection point. In this embodiment the connecting means 550 comprise a digital-to-analogue converter (DAC) 522 that converts the output signal 503 of the digital pre-compensation filter 521 into analogue form and an analogue low-pass filter 523 that filters the analogue output signal 504 of the DAC. The analogue low-pass filter 523 does not have an significant effect on the frequency range of the modulation signal, but it is used for removing multiplied spectra that locate on integer multiples of the sample rate. The output signal 507 of the controlled oscillator, i.e. modulated signal, is fed to a frequency divider 527 that can be an integer divider with an integer division ratio or a fractional divider with a non-integer rational division ratio.

A fractional frequency divider can be realized, for example, as an integer divider that has two different integer division ratios one of them being smaller and another of them being greater than a desired fractional division ratio. These two integer division ratios are alternated according to a predetermined pattern or alternation of the integer division ratios can be controlled using a known sigma-delta principle. The output signal 509 of the frequency divider 527 and a reference signal 510 are fed to a phase comparator 526. The output signal 508 of the phase comparator 526 is proportional to phase shift between signals 510 and 509. The output signal 508 of the phase comparator 526 is filtered with an analogue loop filter 525. In certain designs an output of the phase comparator is a low-impedance voltage source and an input of the loop filter must be fed with a high impedance current source. In this kind of case a voltage-to-current transformer, i.e. a charge pump, is used. The output signal 506 of the loop filter is one of the inputs of the controlled oscillator 524. A centre frequency of the modulated signal 507 depends on the frequency of the reference signal 510 and on the division ratio of the frequency divider 527. The frequency divider can be designed to have several different division ratios so that one of them can be selected per time. For example, in a mobile communication device this enables the modulator to support several RF-channels with a same reference signal frequency.

Figure 6:
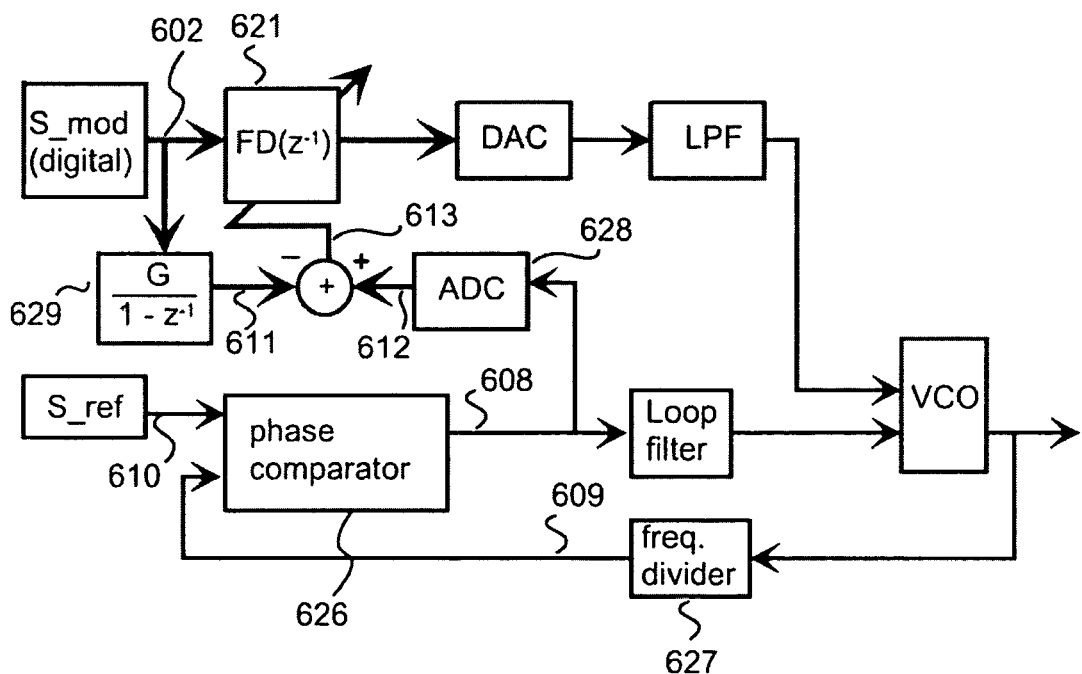
FIG. 6 shows a block diagram of a direct modulator according to an embodiment of the invention having an adaptive pre-compensation filter.

FIG. 6 shows a block diagram of a direct modulator according to an embodiment of the invention. Digital signals are presented with a bigger line width than analogue signals. This embodiment is otherwise similar to the embodiment shown in FIG. 5, but the digital pre-compensation filter 621 is an adaptive filter. Filter parameters of the digital pre-compensation filter 621 are adjusted during operation with an on-line adaptation algorithm. Therefore, the pre-compensation filter is able to adapt, for example, to changes in properties of a phase locked loop due to temperature variations. If the pre-compensation filter 621 has optimal filter parameters there is a flat and phase linear transfer function between a time integral of a modulation signal 602 and an quantity that represents a phase shift between an output signal 609 of a frequency divider 627 and a reference signal 610. An error quantity 613 that is used for filter adaptation is formed substantially as a difference between an analogue-to-digital converted 612 output of a phase comparator 626 and a time-integral 611 of the modulation signal 602. The time-integral of the modulation signal is formed with a digital integrator 629 having an appropriate gain. The analogue-to-digital conversion for the output of a phase comparator is performed with an analogue-to-digital converter 628. If the digital pre-compensation filter is an FIR-filter an on-line adaptation algorithm can be, for example, a least mean square algorithm (LMS) in which tap coefficients of an FIR-filter are adjusted according to correlation between an error quantity and sample values stored in a delay line of an FIR-filter.

Figure 7:
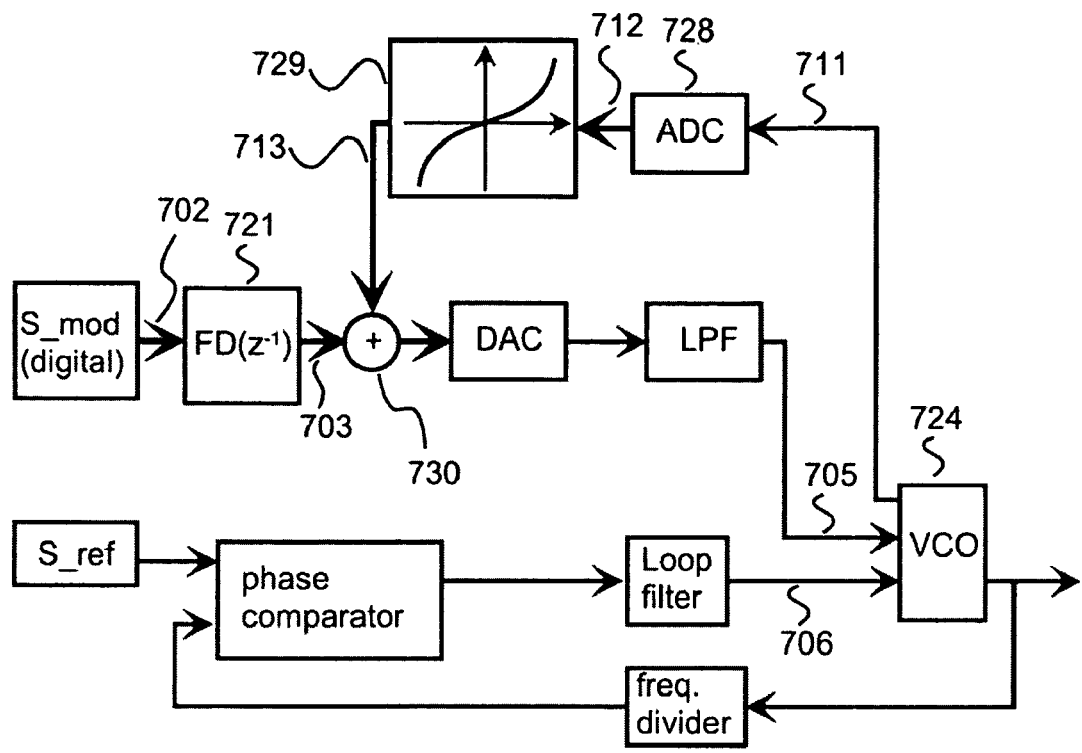
FIGS. 7 and 8 show block diagrams of a direct modulator according to embodiments of the invention having a pre-distortion device.

FIG. 7 shows a block diagram of a direct modulator according to an embodiment of the invention. Digital signals are presented with a bigger line width than analogue signals. This embodiment is otherwise similar to an embodiment shown in FIG. 5 or in FIG. 6, but there is a digital pre-distortion device for compensating non-linearity of a controlled oscillator 724. The instantaneous output frequency of the controlled oscillator depends on both input signals 705 and 706. For example, the output frequency can be a function of a (weighted) sum of the input signals 705 and 706. In an ideal case the instantaneous output frequency versus the (weighted) sum curve is a straight line. In FIG. 7, signal 711 is a monitoring signal of the controlled oscillator 724 and it expresses joint effect of input signal 705 and 705 on determination of the output frequency. The monitoring signal 711 is analogue-to-digital converted with an analogue-to-digital converter 728. The resulting digital signal 712 is fed to a pre-distortion device 729 that determines a pre-distortion value 713 that is added 730 to output signal 703 of a pre-compensation filter 721 in order to compensate non-linearity of the controlled oscillator 724. In a closed loop for pre-distortion there is a delay of at least one clock cycle of digital sample clock, but this fact does not substantially deteriorate performance, because rate of the sample clock has to be anyway far above highest frequency components of a modulation signal 702. The pre-distortion device 729 can be, for example, a memory element storing a set of pre-distortion values 713 and for which the signal 712 acts as an address for a memory lookup. A memory element can be e.g. a read only memory (ROM) or a random access memory (RAM). Lookup tables up to certain size can also be realized as a combinatorial logic circuit. A result of the lookup is the pre-distortion value 713. Therefore, a non-linear characteristic of the controlled oscillator is stored in a memory.

Figure 8:
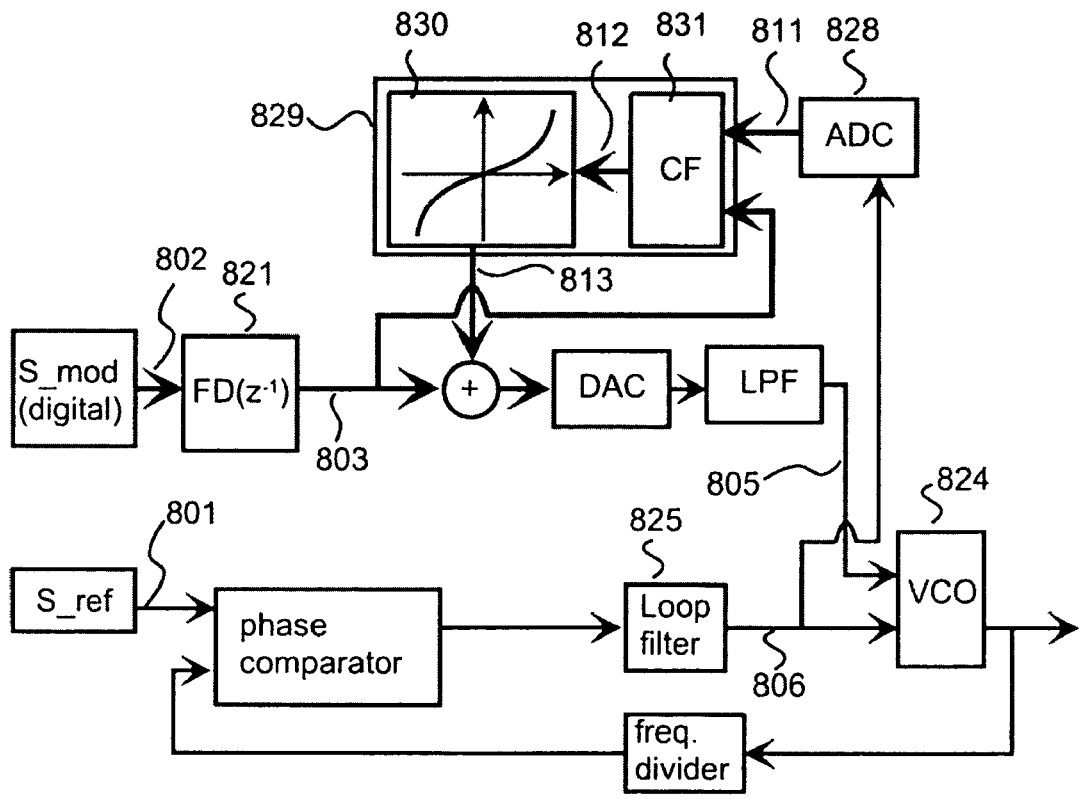

FIG. 8 shows a block diagram of a direct modulator according to an embodiment of the invention having a pre-distortion device. Digital signals are presented with a bigger line width than analogue signals. In this embodiment the input signals of the digital pre-distortion device 829 are analogue-to-digital converted output signal of a loop filter 825 and output signal of a digital precompensation filter 821. The output signal of a loop filter 825 is analogue-to-digital converted with an analogue-to-digital converter 828. The pre-distortion device 829 has a combination element 831 that models the joint effect of input signals 805 and 806 to a controlled oscillator 824. In simplest form the combination element 831 is an adder. Output signal 812 of the combination element 829 acts as an address for memory look-up 830. A result of the lookup is a pre-distortion value 813. Instead of using the combination element 831 it is possible to use a two-dimensional lookup table having both signals 811 and 803 as input signals.

Pre-distortion values that are stored in look-up tables can be obtained by measurements or simulations performed for a controlled oscillator. A modulator can be built such that an identification process that measures a desired amount of points on an output frequency versus input signal curve is run when power is switched on and/or when the centre frequency is changed. The identification process can be controlled with a microprocessor and with appropriate software. The measurements can be performed, for example, with a method comprising (referring to FIG. 8):

setting frequency of reference signal 801 to a desired measurement value f_meas, setting frequency division ratio to desired measurement value Q_meas, setting signal 803 to a desired measurement value hp_meas, measuring and analogue-to-digital converting output signal 806 of a loop filter 825, Ip_meas.

Figure 9:
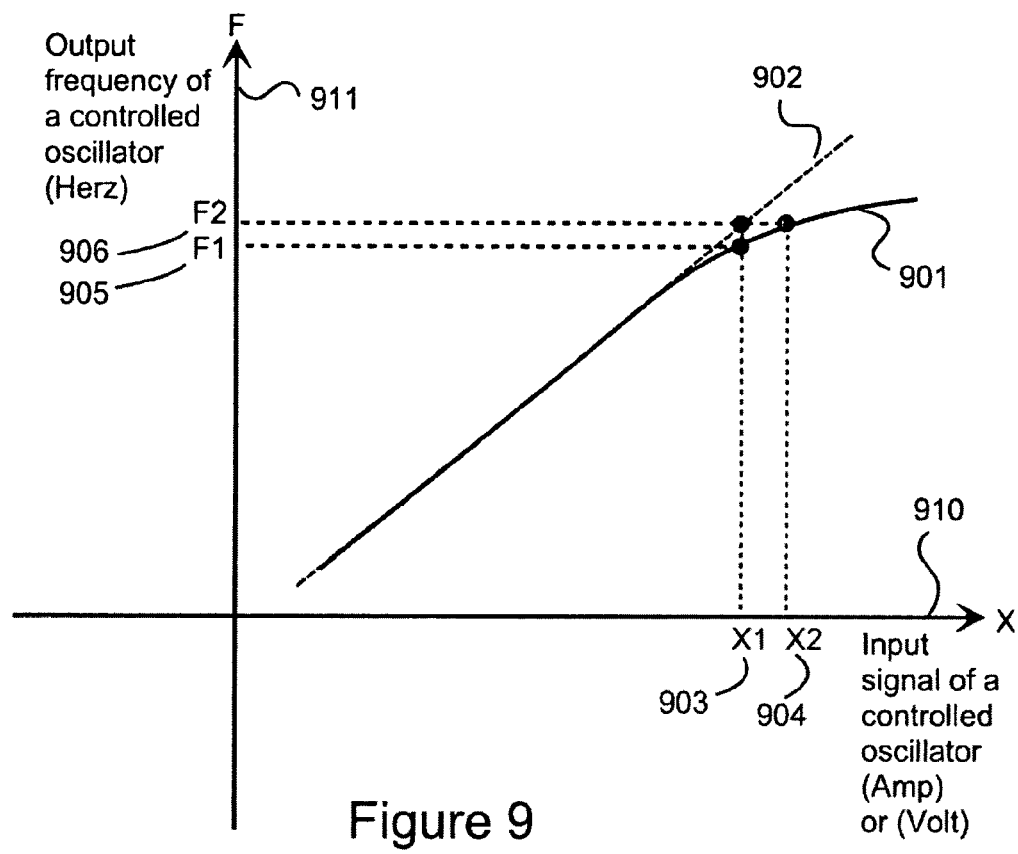
FIG. 9 shows an exemplary output frequency of a controlled oscillator versus input signal value curve.
Figure 10:
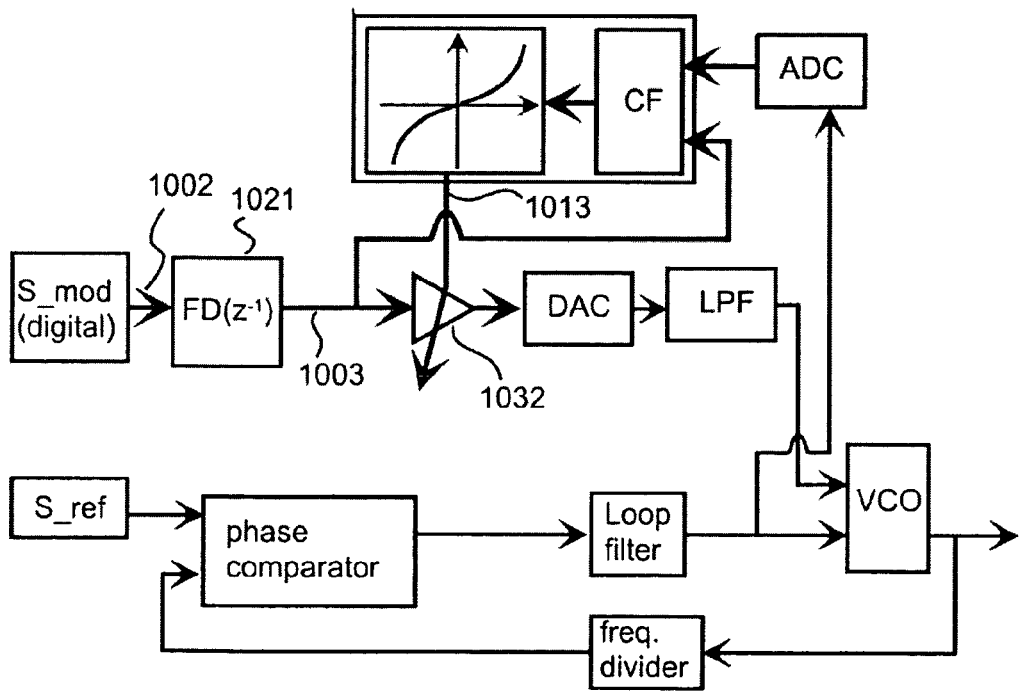
FIG. 10 shows a block diagram of a direct modulator according to an embodiment of the invention having a pre-distortion device.

With this kind of process we obtain one point in (f_out, hp_meas, lp_meas) space, where f_out (=f_meas * Q_meas)

is the output frequency of a controlled oscillator 824. We actually utilize a phase locked loop in the measuring process. The measured points can be stored in a memory element and they can be used for parameterization of a function like 831. Intermediate points between the measured ones can be obtained e.g. by spline fitting. FIG. 9 shows an exemplary characteristic of a controlled oscillator that can have been obtained by measurements. The horizontal axis 910 (X-axis) represents a value of input signal of a controlled oscillator or a joint effect of inputs signals in a case of more than one input signal. Referring to FIG. 8 an X-axis value corresponds with signal 812. The vertical axis 911 (F-axis) represents output frequency of a controlled oscillator. The output frequency is a function of an X-axis value; this is illustrated by a curve 901. A straight line 902 represents a linear characteristic of a hypothetical controlled oscillator. Assume that an X-axis value is X1 (reference 903 in FIG. 9). In this case output frequency of a controlled oscillator is F1 (reference 905 in FIG. 9). A desired output frequency is, however, F2 (reference 906 in FIG. 9), because it corresponds with a hypothetical linear characteristic of a controlled oscillator. In order to get output frequency F2 the X-axis value has to be X2 (reference 904 in FIG. 9). Therefore, in the embodiments shown in FIGS. 7 and 8 a predistortion value corresponding to the X-axis value X1 is substantially the difference X2−X1. FIG. 10 shows an embodiment of the invention in which predistortion is accomplished by a controllable gain element 1032 by which output signal 1003 of a pre-compensation filter 1021 is multiplied. In this case a pre-distortion value 1013, i.e. a gain, is X2/X1.

A pre-distortion device in the embodiments of the invention described above and in FIGS. 7, 8 and 10 can be used also without a pre-compensation filter 721, 821, 1021. In this kind of case a pre-distortion operation is imposed to modulation signal 702, 802, 1002 instead of output signal 703, 803, 1003 of a pre-compensation filter.

In the exemplary embodiments described above we have assumed that nonlinearity that is to be handled with pre-distortion is memoryless, i.e. a required pre-distortion depends only on current situation but not on history. In most cases an assumption of memorylessness of non-linearity is valid with sufficient accuracy. With digital signal processing it is, however, possible to realize a pre-distortion device in which a produced pre-distortion value depends not only on current situation but also on past. One embodiment of the invention is such that there is a delay line for input values (like signals 803 and 811 in FIG. 8) of the pre-distortion device corresponding with successive clock cycles of a sample clock. A pre-distortion value is determined as a function of the values stored in the delay line. Measurement work for defining a required multi-dimensional lookup table for history dependent non-linearity is naturally substantially greater than work for defining a lookup table for memoryless non-linearity.

A signal that is injected to a high-pass injection point of a phase locked loop (PLL) is treated as if it were noise at an input of a controlled oscillator. A PLL tries to clean up the effect of the injected signal. The wider is a bandwidth of a closed-loop transfer function of a PLL, the more powerful is this cleaning effect. In a high-pass direct modulator a PLL needs only to keep synchronism with a reference signal (e.g. reference 510 in FIG. 5). Most of the time the reference signal has a substantially constant frequency. Therefore, a PLL does not need to be able to track quick changes and thus the bandwidth of a closed-loop transfer function of a PLL can be narrow. Exceptional situations when a PLL needs to be able to track quick changes are start-up of a modulator and change of centre frequency of modulated signal.

A direct modulator according to an embodiment of the invention is such that a PLL of the direct modulator has a programmable bandwidth of a closed-loop transfer function of a PLL. The bandwidth can be selected from at least two different values. The bandwidth of a closed-loop transfer function of a PLL can be made programmable, for example, with an adjustable gain in series with a loop filter or with one or more adjustable components (e.g. resistor, capacitor) in the loop filter so that the bandwidth of the loop filter can be adjusted. An adjustable component can be realized as e.g. a set of components plus switches for activating/deactivating desired components of the set and, therefore, to alter resulting electrotechnical value of the set of components.

Another alternative to realize an adjustable component is to use a semiconductor component, e.g. a varactor, a small signal characteristic of which is adjusted with biasing. A wide bandwidth of a closed-loop transfer function of a PLL is advantageously used at start up of and for quick tuning to a given centre frequency. A programmable bandwidth of a closed-loop transfer function of a PLL can be used with a digital pre-compensation filter and/or with a digital pre-distortion device.

Figure 11:
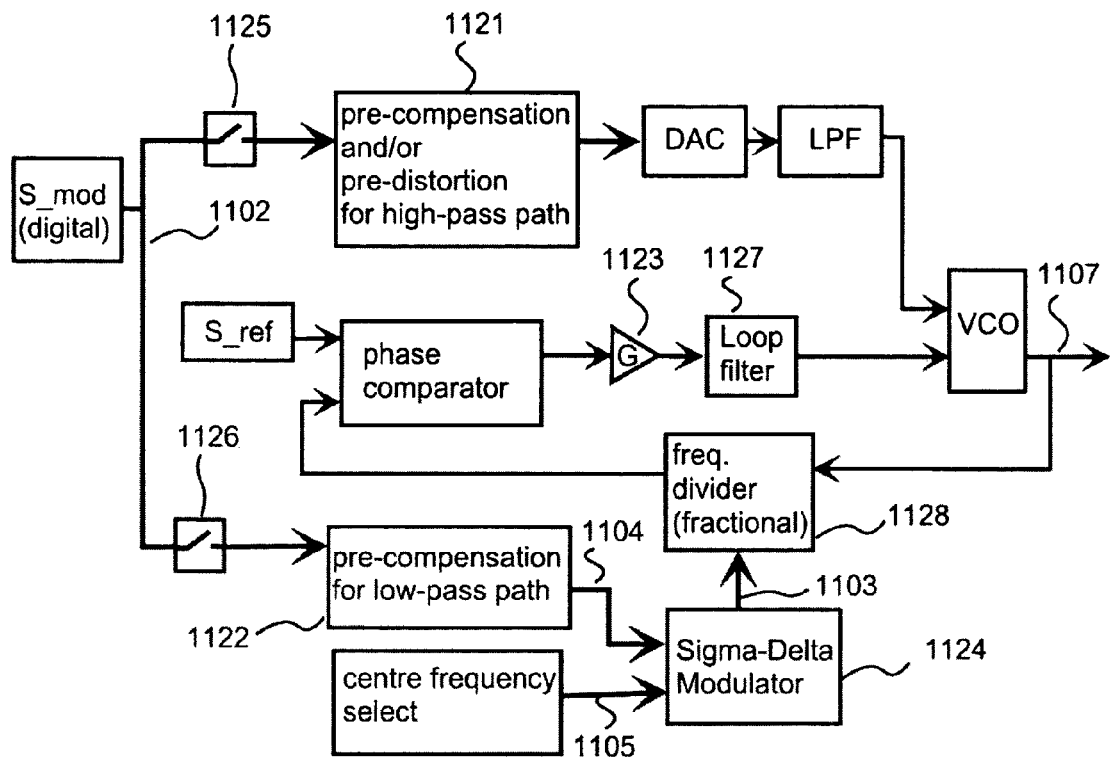
FIG. 11 shows a block diagram of a direct modulator according to an embodiment of the invention having selectable high-pass and low-pass modulation modes.

An embodiment of the invention is shown in FIG. 11. In this embodiment there are means for both high-pass and low-pass direct modulation and there are switch elements 1125 and 1126 so that it is possible to use a modulator as a low-pass direct modulator or as a high-pass direct modulator. When a high-pass path is used, the signal injection to a low-pass injection point is switched off and vice versa. When the modulator is used as a high-pass direct modulator modulation, the signal 1102 is treated with a digital precompensation filter and/or digital pre-distortion device, block 1121. The block 1121 can be such as in the embodiments of the invention described above and with the aid of FIGS. 5-10.

When the modulator is used as a low-pass direct modulator modulation, the signal 1102 can be treated with a digital pre-compensation filter 1122. It is possible that block 1122 is a straight line, i.e. no filtering is performed. The pre-compensation filter 1122 can be a finite impulse response (FIR) filter or an infinite impulse response filter (IIR). Filter parameters can be obtained e.g. by simulations or experiments. Output signal 1104 of a pre-compensation filter 1122 controls a sigma-delta modulator 1124. The sigma-delta modulator can be set to different positions by centre frequency selection signal 1105. The signal 1105 is changed when centre frequency of modulated signal 1107 is changed. The sigma-delta modulator 1124 (called also a delta-sigma modulator) controls a fractional frequency divider 1128. The fractional divider 1128 can be realized, for example, as an integer divider that has two different integer division ratios one of them being smaller and another of them being greater than a fractional division ratio. These two integer division ratios are alternated according to output signal 1103 of the sigma-delta modulator. The digital pre-compensation filter 1122, the sigma-delta modulator 1124, and the fractional frequency divider 1124 represent means for operating the direct modulator as a low-pass direct modulator by feeding a low-pass injection point of a phase locked loop. The low-pass injection point is realized with the fractional frequency divider. Naturally in this embodiment, the sigma-delta modulator and the fractional frequency divider have roles when the modulator is not operated as a low-pass direct modulator.

A phase locked loop (PLL) of this embodiment has a programmable bandwidth of a closed-loop transfer function. The bandwidth of a closed-loop transfer function of a PLL can be made programmable with an adjustable gain 1123 in series with a loop filter 1127 or with adjustable component values in the loop filter 1127 so that the bandwidth of the loop filter can be adjusted. It is advantageous to use narrow bandwidth of a closed-loop transfer function of a PLL when the direct modulator is used as a high-pass direct modulator and to use wider bandwidth of the closed-loop transfer function of a PLL when the direct modulator is used as a low-pass direct modulator.

Figure 12:
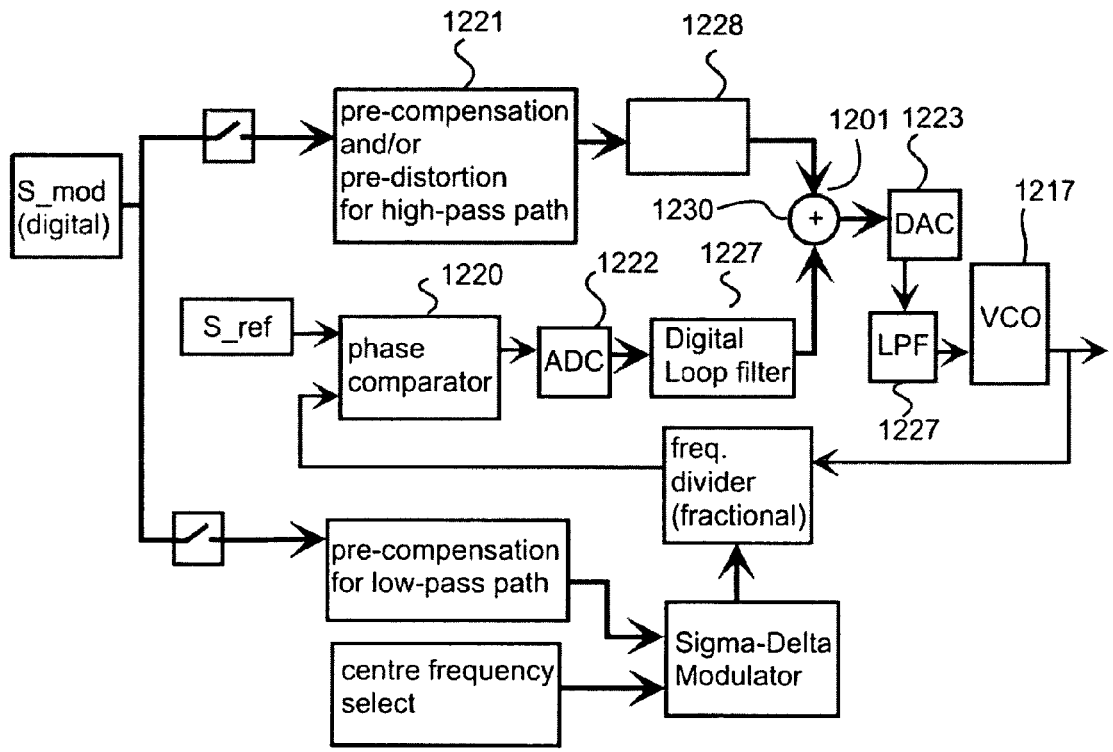
FIG. 12 shows a block diagram of a direct modulator according to an embodiment of the invention having a digital modulation input in a phase locked loop.

FIG. 12 shows an embodiment of the invention in which a high-pass injection point a phase-locked loop supports a digital signal form. In this embodiment the output signal of a phase comparator 1220 is converted to digital form with an analogue-to-digital converter (ADC) 1222 or the phase comparator has been built in a way that its output signal is already in a digital form. An advantage of this concept is the fact that the loop filter 1227 can be realized as a digital filter. A digital loop filter is easy to make programmable and there is no uncertainty problems associated with component values as in conjunction with an analogue loop filter. In this case the high-pass injection point is an input 1201 of a digital adder 1230. Connecting means comprise an adder 1230 and a block 1228 that converts the output signal of digital processing means 1221 into a form supported by the high-pass injection point. It is possible be that no conversion is needed, i.e. connecting means 1221 comprise only the adder 1230, but it is also possible that a format of a digital representation, a number of bits in a sample, and/or a sampling rate do not correspond with each others at the output of the digital processing means 1221 and at the high-pass injection point. In this case the connection means performs a rate conversion with numerical decimation or interpolation, word length conversion by truncation plus rounding or by adding zero or sign bits, and/or a format conversion e.g. from two's complement to one's complement. The output of the adder 1230 is digital-to-analogue converted with a digital-to analogue converter (DAC) 1223 and filtered with an analogue low-pass filter 1227. The result is fed to an input of a controlled oscillator 1217. The analogue low-pass filter does not have an significant effect on the frequency range of the modulation signal, but it is used for removing multiplied spectra that locate on integer multiples of the sample rate.

Figure 13:
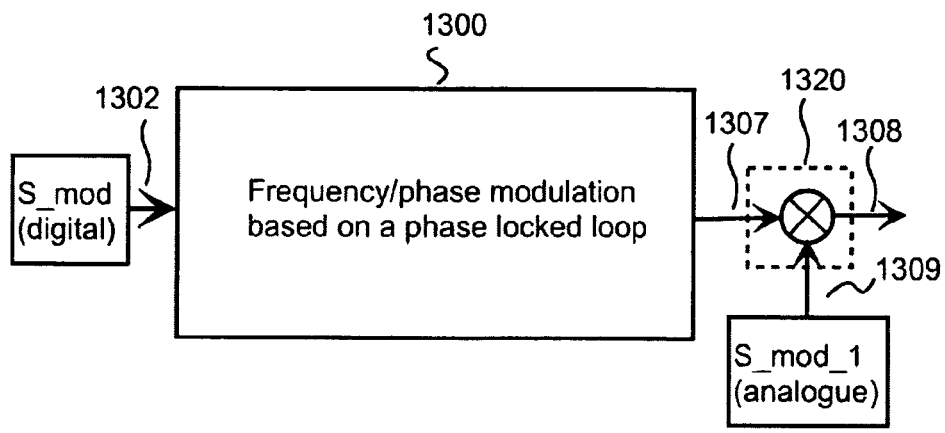
FIG. 13 shows a block diagram of a direct modulator according to an embodiment of the invention that is able to perform polar modulation.

FIG. 13 shows a block diagram of a direct modulator according to an embodiment of the invention that is able to perform polar modulation. In this document a polar modulator is seen as a sub-category of direct modulators. Block 1300 represents a system that can be similar to any of the embodiments of the invention described above and with the aid of FIGS. 5-12. The output signal 1307 of the block 1300 is multiplied by amplitude modulation signal 1309 that may contain different information than modulation signal 1302. In certain applications it is advantageous if amplitude modulation 1320 does not cause abrupt 180 degrees phase jumps in the modulated signal 1308. This is can be achieved by preventing the amplitude modulation signal 1309 to change its polarity. For example, the amplitude modulation signal 1309 can be A+s(t), where s(t) is an information carrying part as a function of time and A is a constant such that the absolute value of s(t) never exceeds the absolute value of A.

One specific application of this embodiment of the invention when the block 1300 contains a system shown in FIG. 11 and described above is a multimode WCDMA+GSM/EDGE system (Wide band Code Division Multiple Access, Global System Mobile, Enhanced Data rates for GSM Evolution). When a transmitter is working on WCDMA mode a high-pass path is selected, a low-pass path is disabled and amplitude modulation is used. Narrow bandwidth for a programmable closed-loop transfer function is selected (few tens of kHz). When a transmitter is working on EDGE mode, a high-pass path is disabled, a low-pass path is selected and amplitude modulation is used. Wide bandwidth for a programmable closed-loop transfer function is selected (150-200 kHz). When a transmitter is working on GSM mode a high-pass path is disabled, a low-pass path is selected and amplitude modulation is not used. Wide bandwidth for a programmable closed-loop transfer function is selected (150-200 kHz).

Figure 14:
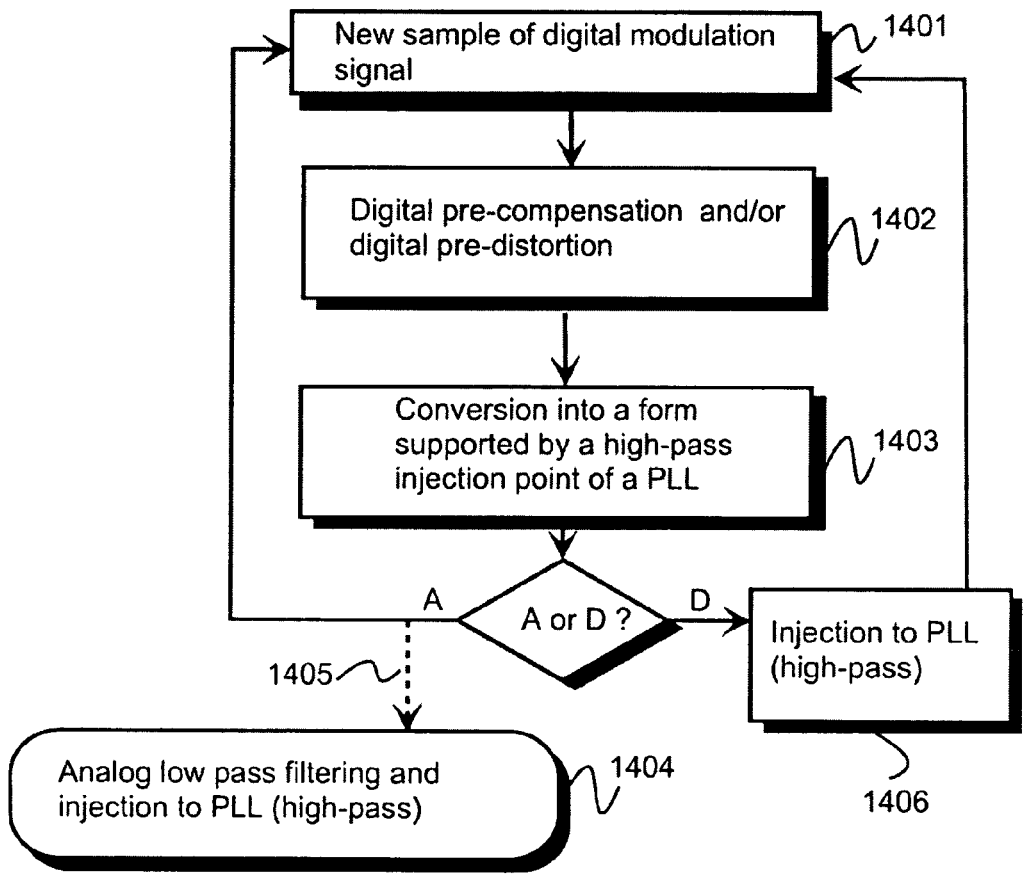
FIG. 14 shows a flow chart for a method for performing a direct modulation according to an embodiment of the invention.

A flow chart for a method for performing a direct modulation according to an embodiment of the invention is presented in FIG. 14. A closed-loop in the flow diagram is circulated at the rate of a sample clock of digital signal processing. In phase 1401 a new sample of digital modulation signal is received at an input of a modulator. In phase 1402 digital output value of a precompensation filter and/or a pre-distortion device is calculated. In phase 1403 the resulting digital value is converted into a form supported by a high-pass injection point of a phase locked loop (PLL). If the high-pass injection point supports an analogue signal form (A), a digital-to-analogue converter gives input signal for analogue signal processing 1404. The dashed line arrow 1405 does not represent a transition between phases in the flow chart but it illustrates a delivery of the input signal. The analogue signal processing runs all the time in parallel with the digital signal processing described above. The analogue signal processing comprises filtering with an analogue low-pass filter that does not have an significant effect on the frequency range of the modulation signal, but it is used for removing multiplied spectra that locate on integer multiples of the sample rate. The output signal of the analogue low-pass filter is injected to a high-pass path of the PLL. If the high-pass injection point supports a digital signal form (D), the conversion phase 1403 may, for example, change the sample rate with numerical decimation or interpolation and/or change number of bits in a digital sample (e.g. truncating plus rounding or adding zero or sign bits). The result of the conversion is injected to the high-pass injection point in phase 1406. The method described above can be combined with the amplitude modulation of the kind described above and in FIG. 13.

Figure 15:
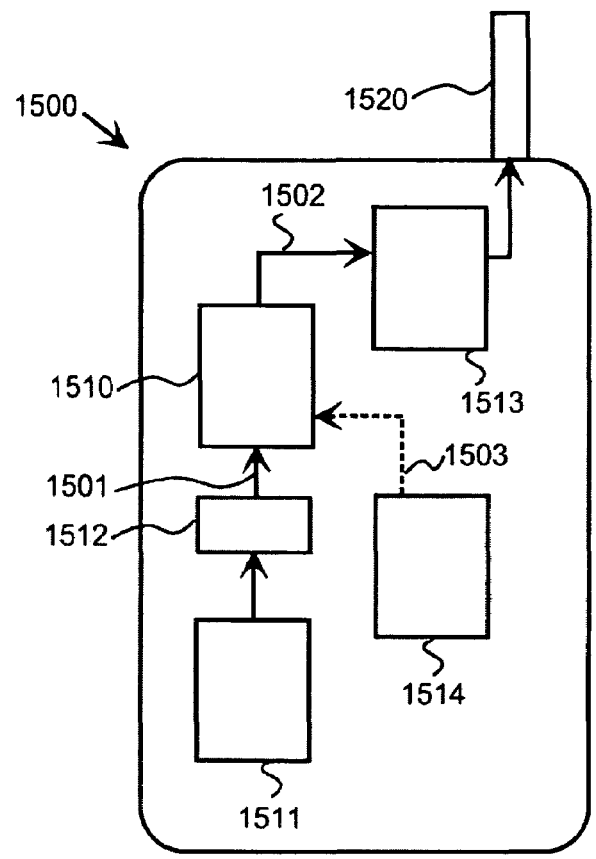
FIG. 15 shows a block diagram of a mobile communication device according to an embodiment of the invention.

A mobile communication device 1500 according to an embodiment of the invention is shown in FIG. 15. The mobile communication device comprises a direct modulator 1510 according to any of the embodiments described above and with the aid of FIGS. 5-13. The direct modulator 1510 transfers information contained by a modulation signal 1501 to a modulated signal 1502, the spectrum of which locates on the radio frequency (RF) range. Information contained by the modulation signal is generated by block 1511 that can be e.g. a microphone, a device for SMS (Short Message Service), or a device for multimedia. A conversion element 1512 converts a signal generated by the block 1511 into a form suitable for the direct modulator 1510. The analogue output signal of the direct modulator, i.e. the modulated signal 1502, is converted by a block 1513 into a form suitable for an antenna 1520 of the mobile communication device. The block 1513 can comprise e.g. a power amplifier and an impedance matching circuitry. Block 1514 is a control unit that controls different operations in the mobile communication device. Dealing with the direct modulator, the control unit 1514 controls the programmable bandwidth of a closed-loop transfer function of a phase locked loop and it controls if the direct modulator is used as a high-pass direct modulator or as a low-pass direct modulator. A dashed line 1503 presents control signals to the direct modulator. Control signals to/from other parts of the mobile communication device are not shown in FIG. 15. The mobile communication device can be e.g. a mobile phone.

Figure 16:
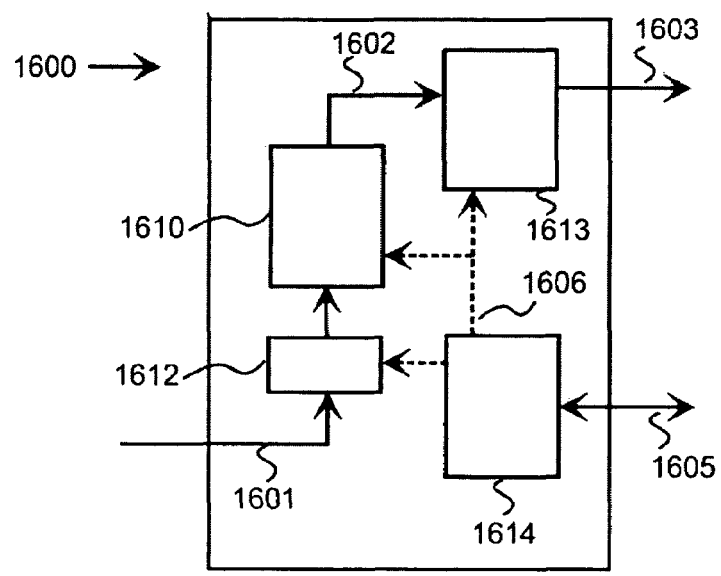
FIG. 16 shows a block diagram of a communication module according to an embodiment of the invention.

A communication module 1600 according to an embodiment of the invention is shown in FIG. 16. The communication module comprises a direct modulator 1610 according to any of the embodiments described above and with the aid of FIGS. 5-13. The communication module has an analogue input or a digital input or both for a signal 1601 that contains information to be transferred to a modulated signal 1602 the spectrum of which locates on radio frequency (RF) range. Block 1612 converts the signal 1601 into a form suitable for the direct modulator 1610. The analogue output signal of the direct modulator, i.e. the modulated signal 1602, is converted by a block 1613 into a form suitable for e.g. an antenna of a mobile communication device. The result of the conversion is an output signal 1603 of the communication module. The block 1613 can comprise e.g. a power amplifier and an impedance matching circuitry. It is also possible that the output signal 1603 of the communication module is directly the modulated signal 1602. Block 1614 is a control unit that controls different operations in the communication module. The control unit 1614 can control the programmable bandwidth of a closed-loop transfer function of a phase locked loop of the direct modulator 1610 and it can control if the direct modulator is used as a high-pass direct modulator or as a low-pass direct modulator. The control unit can control also the conversion blocks 1612 and 1613. The control unit 1614 has a digital input/output bus 1605. Control signals 1606 in the communication module are shown as dashed lines.

It is obvious to a person skilled in the art that the invention and its embodiments are thus not limited to the above-described examples, but may vary within the scope of the independent claims.

What is claimed is:

1. An apparatus comprising:
a phase locked loop having a controlled oscillator,
a modulation signal input for receiving a modulation signal,
a digital processing circuitry for processing a modulation signal in a digital form for performing at least one of the following: compensating an effect of a non-flat frequency response of a high-pass phase locked loop transfer function, and compensating an effect of non-linearity of the controlled oscillator, and
a connection circuitry disposed to convert a digital output signal of said digital processing circuitry into a form supported by a high-pass injection point of the phase locked loop and to operate the direct modulator as a high-pass direct modulator by feeding a resulting converted signal into said high-pass injection point of the phase locked loop.

2. The apparatus according to claim 1, wherein said digital processing circuitry comprises a digital pre-compensation filter disposed to filter the modulation signal for compensating the effect of the non-flat frequency response of the high-pass phase locked loop transfer function.

3. The apparatus according to claim 2, wherein said digital pre-compensation filter is a finite impulse response filter.

4. The apparatus according to claim 2, wherein said digital pre-compensation filter is an adaptive finite impulse response filter.

5. The apparatus according to claim 2, wherein said digital pre-compensation filter is an infinite impulse response filter.

6. The apparatus according to claim 1, wherein said digital processing circuitry comprises a digital pre-distortion device disposed to compensate the effect of non-linearity of the controlled oscillator.

7. The apparatus according to claim 6, wherein said digital pre-distortion device comprises a memory element disposed to store at least one pre-distortion value, the pre-distortion value being disposed to modify at least one input signal of the controlled oscillator for compensating the effect of non-linearity of the controlled oscillator.

8. The apparatus according to claim 1, wherein said connection circutry comprises a digital-to-analogue converter and an analogue low-pass filter.

9. The apparatus according to claim 1, wherein bandwidth of a closed-loop transfer function of said phase locked loop is disposed to be selectable from at least two different values.

10. The apparatus according to claim 9, wherein said bandwidth of a closed-loop transfer function is disposed to be determined with an adjustable gain in series with a loop filter of said phase locked loop.

11. The apparatus according to claim 9, wherein said bandwidth of a closed-loop transfer function is disposed to be determined with at least one adjustable component in the loop filter of said phase locked loop.

12. The apparatus according to claim 1, comprising a first switch element for determining if the direct modulator is operated as a high-pass direct modulator, a circuitry for operating the direct modulator as a low-pass direct modulator, and a second switch element for determining if the direct modulator is operated as a low-pass direct modulator.

13. The apparatus according to claim 12, wherein the circuitry for operating the direct modulator as a low-pass direct modulator comprise a digital pre-compensation filter disposed to filter the modulation signal for compensating the effect of the non-flat frequency response of a low-pass phase locked loop transfer function.

14. The apparatus according to claim 1, comprising an amplitude modulator disposed to modulate amplitude of output signal of the controlled oscillator.

15. A mobile communication device comprising:
a direct modulator having a modulation signal input for receiving a modulation signal and being based on a phase locked loop, the phase locked loop having a controlled oscillator,
digital processing circuitry for processing a modulation signal in a digital form for performing at least one of the following: compensating an effect of a non-flat frequency response of a high-pass phase locked loop transfer function, and compensating an effect of non-linearity of the controlled oscillator, and
a connection circuitry disposed to convert a digital output signal of said digital processing circuitry into a form supported by a high-pass injection point of the phase locked loop and to operate the direct modulator as a high-pass direct modulator by feeding a resulting converted signal into said high-pass injection point of the phase locked loop.

16. The mobile communication device according to claim 15, comprising a control circuitry for selecting a bandwidth of a closed-loop transfer function of said phase locked loop from at least two different values.

17. The mobile communication device according to claim 15, comprising a circuitry for operating the direct modulator as a low-pass direct modulator and control circuitry for determining if the direct modulator is operated as a high-pass direct modulator and for determining if the direct modulator is operated as a low-pass direct modulator.

18. The mobile communication device according to claim 17, wherein the circuitry for operating the direct modulator as a low-pass direct modulator comprise a digital pre-compensation filter disposed to filter the modulation signal for compensating the effect of the non-flat frequency response of a low-pass phase locked loop transfer function.

19. The mobile communication device according to claim 15, wherein the mobile communication device is a mobile phone.

20. A communication module comprising:
a direct modulator having a modulation signal input for receiving a modulation signal and being based on a phase locked loop, the phase locked loop having a controlled oscillator,
a digital processing circuitry for processing a modulation signal in a digital form for performing at least one of the following: compensating an effect of a non-flat frequency response of a high-pass phase locked loop transfer function, and compensating an effect of non-linearity of the controlled oscillator, and
a connection circuitry disposed to convert a digital output signal of said digital processing circuitry into a form supported by a high-pass injection point of the phase locked loop and to operate the direct modulator as a high-pass direct modulator by feeding a resulting converted signal into said high-pass injection point of the phase locked loop.

21. The communication module according to claim 20, comprising control circuitry for selecting a bandwidth of a closed-loop transfer function of said phase locked loop from at least two different values.

22. The communication module according to claim 20, comprising a circuitry for operating the direct modulator as a low-pass direct modulator and a control circuitry for determining if the direct modulator is operated as a high-pass direct modulator and for determining if the direct modulator is operated as a low-pass direct modulator.

23. The communication module according to claim 22, wherein the circuitry for operating the direct modulator as a low-pass direct modulator comprise a digital pre-compensation filter disposed to filter the modulation signal for compensating the effect of the non-flat frequency response of a low-pass phase locked loop transfer function.

24. A method comprising:
processing a modulation signal in a digital form for performing at least one of the following list: compensating an effect of a non-flat frequency response of a high-pass transfer function of a phase locked loop of a direct modulator, and compensating an effect of non-linearity of a controlled oscillator of the phase locked loop of the direct modulator,
converting a digital output signal of said processing into a form supported by a high-pass injection point of the phase locked loop, and
operating the direct modulator as a high-pass direct modulator by feeding a resulting converted signal into said high-pass injection point of the phase locked-loop.

25. The method according to claim 24, wherein said processing the modulation signal in a digital form comprises filtering the modulation signal with a digital filter for compensating the effect of the non-flat frequency response of the high-pass phase locked loop transfer function.

26. The method according to claim 25, wherein said filtering the modulation signal is performed with a digital finite impulse response filter.

27. The method according to claim 25, wherein said filtering the modulation signal is performed with a digital adaptive finite impulse response filter.

28. The method according to claim 25, wherein said filtering the modulation signal is performed with a digital infinite impulse response filter.

29. The method according to claim 24, wherein said processing modulation signal in a digital form comprises compensating the effect of non-linearity of the controlled oscillator with a digital pre-distortion device.

30. The method according to claim 29, wherein said compensating the effect of non-linearity of the controlled oscillator comprises reading at least one pre-distortion value from a memory element and modifying at least one input signal of the controlled oscillator with said pre-distortion value for compensating the effect of non-linearity of the controlled oscillator.

31. The method according to claim 24, wherein said converting the digital output signal comprises analogue-to-digital converting and low-pass filtering of an output of said analogue-to-digital converting.

32. The method according to claim 24, comprising modulating an amplitude of output signal of the controlled oscillator.

33. An apparatus comprising:
means for processing modulation signal in a digital form for performing at least one of the following list: compensating an effect of a non-flat frequency response of a high-pass transfer function of a phase locked loop of a direct modulator, and compensating an effect of non-linearity of a controlled oscillator of the phase locked loop of the direct modulator,
means for converting an digital output signal of said processing into a form supported by a high-pass injection point of the phase locked loop, and means for operating the direct modulator as a high-pass direct modulator by feeding a resulting converted signal into said high-pass injection point of the phase locked-loop.

* * * * *

UNITED STATES PATENT AND TRADEMARK OFFICE
CERTIFICATE OF CORRECTION

| | |
|---|---|
| PATENT NO. | : 7,522,011 B2 |
| APPLICATION NO. | : 11/204759 |
| DATED | : April 21, 2009 |
| INVENTOR(S) | : Jorma Matero et al. |

It is certified that error appears in the above-identified patent and that said Letters Patent is hereby corrected as shown below:

Column 16, line 39, claim 15, line 6, please insert the word --a-- prior to the word "digital".

Column 16, line 58, claim 17, line 3, please insert the word --a-- prior to the word "control".

Signed and Sealed this

Sixteenth Day of June, 2009

JOHN DOLL
*Acting Director of the United States Patent and Trademark Office*